(12) United States Patent
Carpenter et al.

(10) Patent No.: US 7,335,396 B2
(45) Date of Patent: Feb. 26, 2008

(54) METHODS FOR CONTROLLING MASS FLOW RATES AND PRESSURES IN PASSAGEWAYS COUPLED TO REACTION CHAMBERS AND SYSTEMS FOR DEPOSITING MATERIAL ONTO MICROFEATURE WORKPIECES IN REACTION CHAMBERS

(75) Inventors: Craig M. Carpenter, Boise, ID (US); Danny Dynka, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 330 days.

(21) Appl. No.: 10/423,711

(22) Filed: Apr. 24, 2003

(65) Prior Publication Data

US 2004/0226507 A1    Nov. 18, 2004

(51) Int. Cl.
C23C 16/00 (2006.01)
C23C 16/52 (2006.01)
F17D 1/02 (2006.01)
B05C 11/00 (2006.01)

(52) U.S. Cl. .................. 427/248.1; 427/8; 118/692; 137/14; 137/487.5

(58) Field of Classification Search .............. 427/8; 118/692; 137/14, 487.5
See application file for complete search history.

(56) References Cited

U.S. PATENT DOCUMENTS

| | | |
|---|---|---|
| 579,269 A | 3/1897 | Hent |
| 3,618,919 A | 11/1971 | Beck |
| 3,620,934 A | 11/1971 | Endle |
| 3,630,769 A | 12/1971 | Hart et al. |
| 3,630,881 A | 12/1971 | Lester et al. |
| 3,634,212 A | 1/1972 | Valayll et al. |

(Continued)

FOREIGN PATENT DOCUMENTS

DE    198 51 824 A1    5/2000

(Continued)

OTHER PUBLICATIONS

Fitch, J.S., et al., "Pressure-Based Mass-Flow Control Using Thermopneumatically-Actuacted Microvalvesr" Proceedings, Sensors and Actuators Workshop, pp. 162-165 (Transducers Research Foundation, Cleveland, OH, 1998).*

(Continued)

Primary Examiner—Timothy Meeks
Assistant Examiner—David Turocy
(74) Attorney, Agent, or Firm—Perkins Coie LLP (57) ABSTRACT

Methods, apparatuses, and systems for controlling mass flow rates and pressures in passageways coupled to reaction chambers are disclosed herein. In one embodiment, a method includes controlling a mass flow rate in a passageway in response to a first condition by modulating a valve of a mass flow and pressure control unit, and controlling a pressure in the passageway in response to a second condition different than the first condition by modulating the valve of the mass flow and pressure control unit. In another embodiment, an apparatus includes a mass flow measurement device, a pressure sensor, a modulating valve in the passageway, and a controller operably coupled to the mass flow measurement device, the pressure sensor, and the modulating valve. The controller has a computer-readable medium containing instructions to perform the above-mentioned method.

17 Claims, 4 Drawing Sheets

U.S. PATENT DOCUMENTS

| | | | |
|---|---|---|---|
| 4,018,949 A | 4/1977 | Donokowski et al. | |
| 4,242,182 A | 12/1980 | Popescu | |
| 4,269,625 A | 5/1981 | Molenaar | |
| 4,289,061 A | 9/1981 | Emmett | |
| 4,313,783 A | 2/1982 | Davies et al. | |
| 4,388,342 A | 6/1983 | Suzuki et al. | |
| 4,397,753 A | 8/1983 | Czaja | |
| 4,436,674 A | 3/1984 | McMenamin | |
| 4,438,724 A | 3/1984 | Doehler et al. | |
| 4,469,801 A | 9/1984 | Hirai et al. | |
| 4,509,456 A | 4/1985 | Kleinert et al. | |
| 4,545,136 A | 10/1985 | Izu et al. | |
| 4,590,042 A | 5/1986 | Drage | |
| 4,593,644 A | 6/1986 | Hanak | |
| 4,681,777 A | 7/1987 | Engelken et al. | |
| 4,826,579 A | 5/1989 | Westfall | |
| 4,894,132 A | 1/1990 | Tanaka et al. | |
| 4,911,638 A | 3/1990 | Bayne et al. | |
| 4,923,715 A | 5/1990 | Matsuda et al. | |
| 4,948,979 A | 8/1990 | Munakata et al. | |
| 4,949,669 A | 8/1990 | Ishii et al. | |
| 4,966,646 A | 10/1990 | Zdeblick | |
| 4,977,106 A | 12/1990 | Smith | |
| 5,015,330 A | 5/1991 | Okumura et al. | |
| 5,017,404 A | 5/1991 | Paquet et al. | |
| 5,020,476 A | 6/1991 | Bay et al. | |
| 5,062,446 A * | 11/1991 | Anderson | 137/468 |
| 5,076,205 A | 12/1991 | Vowles et al. | |
| 5,090,985 A | 2/1992 | Soubeyrand et al. | |
| 5,091,207 A | 2/1992 | Tanaka | |
| 5,131,752 A | 7/1992 | Yu et al. | |
| 5,136,975 A | 8/1992 | Bartholomew et al. | |
| 5,172,849 A | 12/1992 | Barten et al. | |
| 5,200,023 A | 4/1993 | Gifford et al. | |
| 5,223,113 A | 6/1993 | Kaneko et al. | |
| 5,232,749 A | 8/1993 | Gilton | |
| 5,248,527 A | 9/1993 | Uchida et al. | |
| 5,286,296 A | 2/1994 | Sato et al. | |
| 5,325,020 A | 6/1994 | Campbell et al. | |
| 5,364,219 A | 11/1994 | Takahashi et al. | |
| 5,366,557 A | 11/1994 | Yu | |
| 5,377,429 A | 1/1995 | Sandhu et al. | |
| 5,380,396 A | 1/1995 | Shikida et al. | |
| 5,409,129 A | 4/1995 | Tsukada et al. | |
| 5,418,180 A | 5/1995 | Brown | |
| 5,427,666 A | 6/1995 | Mueller et al. | |
| 5,433,787 A | 7/1995 | Suzuki et al. | |
| 5,433,835 A | 7/1995 | Demaray et al. | |
| 5,445,491 A | 8/1995 | Nakagawa et al. | |
| 5,453,124 A | 9/1995 | Moslehi et al. | |
| 5,480,818 A | 1/1996 | Matsumoto et al. | |
| 5,496,410 A | 3/1996 | Fukuda et al. | |
| 5,498,292 A | 3/1996 | Ozaki | |
| 5,500,256 A | 3/1996 | Watabe | |
| 5,522,934 A | 6/1996 | Suzuki et al. | |
| 5,536,317 A | 7/1996 | Crain et al. | |
| 5,562,800 A | 10/1996 | Kawamura | |
| 5,575,883 A | 11/1996 | Nishikawa et al. | |
| 5,589,002 A | 12/1996 | Su | |
| 5,589,110 A | 12/1996 | Motoda et al. | |
| 5,592,581 A | 1/1997 | Okase | |
| 5,595,606 A | 1/1997 | Fujikawa et al. | |
| 5,599,513 A | 2/1997 | Masaki et al. | |
| 5,624,498 A | 4/1997 | Lee et al. | |
| 5,626,936 A | 5/1997 | Alderman | |
| 5,640,751 A | 6/1997 | Faria | |
| 5,643,394 A | 7/1997 | Maydan et al. | |
| 5,654,589 A | 8/1997 | Huang et al. | |
| 5,693,288 A | 12/1997 | Nakamura | |
| 5,716,796 A | 2/1998 | Bull et al. | |
| 5,729,896 A | 3/1998 | Dalal et al. | |
| 5,746,434 A | 5/1998 | Boyd et al. | |
| 5,754,297 A | 5/1998 | Nulman | |
| 5,766,364 A | 6/1998 | Ishida et al. | |
| 5,769,950 A | 6/1998 | Takasu et al. | |
| 5,769,952 A | 6/1998 | Komino | |
| 5,788,778 A | 8/1998 | Shang et al. | |
| 5,792,269 A | 8/1998 | Deacon et al. | |
| 5,792,700 A | 8/1998 | Turner et al. | |
| 5,819,683 A | 10/1998 | Ikeda et al. | |
| 5,820,641 A | 10/1998 | Gu et al. | |
| 5,827,370 A | 10/1998 | Gu | |
| 5,833,888 A | 11/1998 | Arya et al. | |
| 5,846,275 A | 12/1998 | Lane et al. | |
| 5,846,330 A | 12/1998 | Quirk et al. | |
| 5,851,294 A | 12/1998 | Young et al. | |
| 5,851,849 A | 12/1998 | Comizzoli et al. | |
| 5,865,417 A | 2/1999 | Harris et al. | |
| 5,866,986 A | 2/1999 | Pennington | |
| 5,868,159 A * | 2/1999 | Loan et al. | 137/334 |
| 5,879,459 A | 3/1999 | Gadgil et al. | |
| 5,885,425 A | 3/1999 | Hsieh et al. | |
| 5,895,530 A | 4/1999 | Shrotriya et al. | |
| 5,902,403 A | 5/1999 | Aitani et al. | |
| 5,908,947 A | 6/1999 | Vaartstra | |
| 5,911,238 A * | 6/1999 | Bump et al. | 137/487.5 |
| 5,932,286 A | 8/1999 | Beinglass et al. | |
| 5,953,634 A | 9/1999 | Kajita et al. | |
| 5,956,613 A | 9/1999 | Zhao et al. | |
| 5,958,140 A | 9/1999 | Arami et al. | |
| 5,961,775 A | 10/1999 | Fujimura et al. | |
| 5,968,587 A | 10/1999 | Frankel | |
| 5,972,430 A | 10/1999 | DiMeo, Jr. et al. | |
| 5,994,181 A | 11/1999 | Hsieh et al. | |
| 5,997,588 A | 12/1999 | Goodwin et al. | |
| 5,998,932 A | 12/1999 | Lenz | |
| 6,006,694 A | 12/1999 | DeOrnellas et al. | |
| 6,008,086 A | 12/1999 | Schuegraf et al. | |
| 6,022,483 A | 2/2000 | Aral | |
| 6,032,923 A | 3/2000 | Biegelsen et al. | |
| 6,039,557 A | 3/2000 | Unger et al. | |
| 6,042,652 A | 3/2000 | Hyun et al. | |
| 6,045,620 A | 4/2000 | Tepman et al. | |
| 6,059,885 A | 5/2000 | Ohashi et al. | |
| 6,062,256 A | 5/2000 | Miller et al. | |
| 6,070,551 A | 6/2000 | Li et al. | |
| 6,079,426 A | 6/2000 | Subrahmanyam et al. | |
| 6,080,446 A | 6/2000 | Tobe et al. | |
| 6,086,677 A | 7/2000 | Umotoy et al. | |
| 6,089,543 A | 7/2000 | Freerks | |
| 6,090,210 A | 7/2000 | Ballance et al. | |
| 6,109,206 A | 8/2000 | Maydan et al. | |
| 6,113,698 A | 9/2000 | Raaijmakers et al. | |
| 6,123,107 A | 9/2000 | Selser et al. | |
| 6,129,331 A | 10/2000 | Henning et al. | |
| 6,139,700 A | 10/2000 | Kang et al. | |
| 6,142,163 A | 11/2000 | McMillin et al. | |
| 6,143,077 A | 11/2000 | Ikeda et al. | |
| 6,143,078 A | 11/2000 | Ishikawa et al. | |
| 6,143,659 A | 11/2000 | Leem | |
| 6,144,060 A | 11/2000 | Park et al. | |
| 6,149,123 A | 11/2000 | Harris et al. | |
| 6,159,297 A | 12/2000 | Herchen et al. | |
| 6,159,298 A | 12/2000 | Saito et al. | |
| 6,160,243 A | 12/2000 | Cozad | |
| 6,161,500 A | 12/2000 | Kopacz et al. | |
| 6,173,673 B1 | 1/2001 | Golovato et al. | |
| 6,174,366 B1 | 1/2001 | Ihantola | |
| 6,174,377 B1 | 1/2001 | Doering et al. | |
| 6,174,809 B1 | 1/2001 | Kang et al. | |
| 6,178,660 B1 | 1/2001 | Emmi et al. | |
| 6,182,603 B1 | 2/2001 | Shang et al. | |
| 6,183,563 B1 | 2/2001 | Choi et al. | |
| 6,190,459 B1 | 2/2001 | Takeshita et al. | |

| | | | |
|---|---|---|---|
| 6,192,827 B1 | 2/2001 | Welch et al. | |
| 6,193,802 B1 | 2/2001 | Pang et al. | |
| 6,194,628 B1 | 2/2001 | Pang et al. | |
| 6,197,119 B1 | 3/2001 | Dozoretz et al. | |
| 6,200,415 B1 | 3/2001 | Maraschin | |
| 6,203,613 B1 | 3/2001 | Gates et al. | |
| 6,206,967 B1 | 3/2001 | Mak et al. | |
| 6,206,972 B1 | 3/2001 | Dunham | |
| 6,207,937 B1 | 3/2001 | Stoddard et al. | |
| 6,210,754 B1 | 4/2001 | Lu et al. | |
| 6,211,033 B1 | 4/2001 | Sandhu et al. | |
| 6,211,078 B1 | 4/2001 | Matthews | |
| 6,214,714 B1 | 4/2001 | Wang et al. | |
| 6,237,394 B1 | 5/2001 | Harris et al. | |
| 6,237,529 B1 | 5/2001 | Spahn | |
| 6,245,192 B1 | 6/2001 | Dhindsa et al. | |
| 6,251,190 B1 | 6/2001 | Mak et al. | |
| 6,255,222 B1 | 7/2001 | Xia et al. | |
| 6,263,829 B1 | 7/2001 | Schneider et al. | |
| 6,264,788 B1 | 7/2001 | Tomoyasu et al. | |
| 6,270,572 B1 | 8/2001 | Kim et al. | |
| 6,273,954 B2 * | 8/2001 | Nishikawa et al. | 118/692 |
| 6,277,763 B1 | 8/2001 | Kugimiya et al. | |
| 6,280,584 B1 | 8/2001 | Kumar et al. | |
| 6,287,965 B1 | 9/2001 | Kang et al. | |
| 6,287,980 B1 | 9/2001 | Hanazaki et al. | |
| 6,290,491 B1 | 9/2001 | Shahvandi et al. | |
| 6,291,337 B1 | 9/2001 | Sidhwa | |
| 6,294,394 B1 | 9/2001 | Erickson et al. | |
| 6,297,539 B1 | 10/2001 | Ma et al. | |
| 6,302,964 B1 | 10/2001 | Umotoy et al. | |
| 6,302,965 B1 | 10/2001 | Umotoy et al. | |
| 6,303,953 B1 | 10/2001 | Doan et al. | |
| 6,305,314 B1 | 10/2001 | Sneh et al. | |
| 6,309,161 B1 | 10/2001 | Hofmeister | |
| 6,315,859 B1 | 11/2001 | Donohoe | |
| 6,321,680 B2 | 11/2001 | Cook et al. | |
| 6,328,803 B2 | 12/2001 | Rolfson et al. | |
| 6,329,297 B1 | 12/2001 | Balish et al. | |
| 6,333,272 B1 | 12/2001 | McMillin et al. | |
| 6,334,928 B1 | 1/2002 | Sekine et al. | |
| 6,342,277 B1 | 1/2002 | Sherman | |
| 6,346,477 B1 | 2/2002 | Kaloyeros et al. | |
| 6,347,602 B2 | 2/2002 | Goto et al. | |
| 6,347,918 B1 | 2/2002 | Blahnik | |
| 6,355,561 B1 | 3/2002 | Sandhu et al. | |
| 6,358,323 B1 | 3/2002 | Schmitt et al. | |
| 6,364,219 B1 | 4/2002 | Zimmerman et al. | |
| 6,374,831 B1 | 4/2002 | Chandran et al. | |
| 6,383,300 B1 | 5/2002 | Saito et al. | |
| 6,387,185 B2 | 5/2002 | Doering et al. | |
| 6,387,207 B1 | 5/2002 | Janakiraman et al. | |
| 6,402,806 B1 | 6/2002 | Schmitt et al. | |
| 6,402,849 B2 | 6/2002 | Kwag et al. | |
| 6,415,736 B1 | 7/2002 | Hao et al. | |
| 6,419,462 B1 | 7/2002 | Horie et al. | |
| 6,420,230 B1 | 7/2002 | Derderian et al. | |
| 6,420,742 B1 | 7/2002 | Ahn et al. | |
| 6,425,168 B1 | 7/2002 | Takaku et al. | |
| 6,428,859 B1 | 8/2002 | Chiang et al. | |
| 6,432,256 B1 | 8/2002 | Raoux | |
| 6,432,259 B1 | 8/2002 | Noorbaksh et al. | |
| 6,432,831 B2 | 8/2002 | Dhindsa et al. | |
| 6,435,865 B1 | 8/2002 | Tseng et al. | |
| 6,444,039 B1 | 9/2002 | Nguyen | |
| 6,450,117 B1 | 9/2002 | Murugesh et al. | |
| 6,451,119 B2 | 9/2002 | Sneh et al. | |
| 6,458,416 B1 | 10/2002 | Derderian et al. | |
| 6,461,436 B1 | 10/2002 | Campbell et al. | |
| 6,461,931 B1 | 10/2002 | Eldridge | |
| 6,474,700 B2 | 11/2002 | Redemann et al. | |
| 6,503,330 B1 | 1/2003 | Sneh et al. | |
| 6,506,254 B1 | 1/2003 | Bosch et al. | |
| 6,507,007 B2 | 1/2003 | Van Bilsen | |
| 6,508,268 B1 * | 1/2003 | Kouketsu | 137/488 |
| 6,509,280 B2 | 1/2003 | Choi | |
| 6,534,007 B1 | 3/2003 | Blonigan et al. | |
| 6,534,395 B2 | 3/2003 | Werkhoven et al. | |
| 6,540,838 B2 | 4/2003 | Sneh et al. | |
| 6,541,353 B1 | 4/2003 | Sandhu et al. | |
| 6,551,929 B1 | 4/2003 | Kori et al. | |
| 6,562,140 B1 | 5/2003 | Bondestam et al. | |
| 6,562,141 B2 | 5/2003 | Clarke | |
| 6,573,184 B2 | 6/2003 | Park | |
| 6,579,372 B2 | 6/2003 | Park | |
| 6,579,374 B2 | 6/2003 | Bondestam et al. | |
| 6,585,823 B1 | 7/2003 | Van Wijck | |
| 6,589,868 B2 | 7/2003 | Rossman | |
| 6,596,085 B1 | 7/2003 | Schmitt et al. | |
| 6,602,346 B1 | 8/2003 | Gochberg | |
| 6,613,656 B2 | 9/2003 | Li | |
| 6,622,104 B2 | 9/2003 | Wang et al. | |
| 6,630,201 B2 | 10/2003 | Chiang et al. | |
| 6,634,314 B2 | 10/2003 | Hwang et al. | |
| 6,635,965 B1 | 10/2003 | Lee et al. | |
| 6,638,672 B2 | 10/2003 | Deguchi | |
| 6,638,859 B2 | 10/2003 | Sneh et al. | |
| 6,638,879 B2 | 10/2003 | Hsieh et al. | |
| 6,641,673 B2 | 11/2003 | Yang | |
| 6,656,282 B2 | 12/2003 | Kim et al. | |
| 6,663,713 B1 | 12/2003 | Robles et al. | |
| 6,666,982 B2 | 12/2003 | Brcka | |
| 6,673,196 B1 | 1/2004 | Oyabu | |
| 6,686,594 B2 | 2/2004 | Ji et al. | |
| 6,689,220 B1 | 2/2004 | Nguyen | |
| 6,704,913 B2 | 3/2004 | Rossman | |
| 6,705,345 B1 | 3/2004 | Bifano | |
| 6,706,334 B1 | 3/2004 | Kobayashi et al. | |
| 6,716,284 B2 | 4/2004 | Campbell et al. | |
| 6,734,020 B2 | 5/2004 | Lu et al. | |
| 6,758,911 B2 | 7/2004 | Campbell et al. | |
| 6,770,145 B2 | 8/2004 | Saito et al. | |
| 6,773,507 B2 | 8/2004 | Jallepally et al. | |
| 6,787,185 B2 | 9/2004 | Derderian et al. | |
| 6,787,463 B2 | 9/2004 | Mardian et al. | |
| 6,796,316 B2 | 9/2004 | Park | |
| 6,800,139 B1 | 10/2004 | Shinriki et al. | |
| 6,800,172 B2 | 10/2004 | Carpenter et al. | |
| 6,800,173 B2 | 10/2004 | Chiang et al. | |
| 6,807,971 B2 | 10/2004 | Saito et al. | |
| 6,814,813 B2 | 11/2004 | Dando et al. | |
| 6,818,067 B2 | 11/2004 | Doering et al. | |
| 6,818,249 B2 | 11/2004 | Derderian | |
| 6,820,570 B2 | 11/2004 | Kilpela et al. | |
| 6,821,347 B2 | 11/2004 | Carpenter et al. | |
| 6,828,218 B2 | 12/2004 | Kim et al. | |
| 6,830,652 B1 | 12/2004 | Ohmi et al. | |
| 6,831,315 B2 | 12/2004 | Raaijmakers et al. | |
| 6,838,114 B2 | 1/2005 | Carpenter et al. | |
| 6,845,734 B2 | 1/2005 | Carpenter et al. | |
| 6,849,131 B2 | 2/2005 | Chen et al. | |
| 6,858,264 B2 | 2/2005 | Dando et al. | |
| 6,861,094 B2 | 3/2005 | Derderian et al. | |
| 6,861,356 B2 | 3/2005 | Matsuse et al. | |
| 6,869,500 B2 | 3/2005 | Lee et al. | |
| 6,881,295 B2 | 4/2005 | Nagakura et al. | |
| 6,884,296 B2 | 4/2005 | Basceri et al. | |
| 6,890,386 B2 | 5/2005 | DeDontney et al. | |
| 6,905,547 B1 | 6/2005 | Londergan et al. | |
| 6,905,549 B2 | 6/2005 | Okuda et al. | |
| 6,916,398 B2 | 7/2005 | Chen et al. | |
| 6,926,775 B2 | 8/2005 | Carpenter et al. | |
| 6,966,936 B2 | 11/2005 | Yamasaki et al. | |
| 6,991,684 B2 | 1/2006 | Kannan et al. | |
| 7,022,184 B2 | 4/2006 | Van Wijck et al. | |
| 7,086,410 B2 | 8/2006 | Chouno et al. | |

| | | |
|---|---|---|
| 2001/0001952 A1 | 5/2001 | Nishizawa et al. |
| 2001/0012697 A1 | 8/2001 | Mikata |
| 2001/0045187 A1 | 11/2001 | Uhlenbrock |
| 2001/0050267 A1 | 12/2001 | Hwang et al. |
| 2001/0054484 A1 | 12/2001 | Komino |
| 2002/0000202 A1 | 1/2002 | Yuda et al. |
| 2002/0042205 A1 | 4/2002 | McMillin et al. |
| 2002/0073924 A1 | 6/2002 | Chiang et al. |
| 2002/0076507 A1 | 6/2002 | Chiang et al. |
| 2002/0076508 A1 | 6/2002 | Chiang et al. |
| 2002/0100418 A1 | 8/2002 | Sandhu et al. |
| 2002/0104481 A1 | 8/2002 | Chiang et al. |
| 2002/0129768 A1 | 9/2002 | Carpenter et al. |
| 2002/0132374 A1 | 9/2002 | Basceri et al. |
| 2002/0144655 A1 | 10/2002 | Chiang et al. |
| 2002/0185067 A1 | 12/2002 | Upham |
| 2002/0195056 A1 | 12/2002 | Sandhu et al. |
| 2002/0195145 A1* | 12/2002 | Lowery et al. .......... 137/487.5 |
| 2002/0195201 A1 | 12/2002 | Beer |
| 2002/0197402 A1 | 12/2002 | Chiang et al. |
| 2003/0000473 A1 | 1/2003 | Chae et al. |
| 2003/0003697 A1 | 1/2003 | Agarwal et al. |
| 2003/0003730 A1 | 1/2003 | Li |
| 2003/0023338 A1 | 1/2003 | Chin et al. |
| 2003/0024477 A1 | 2/2003 | Okuda et al. |
| 2003/0027428 A1 | 2/2003 | Ng et al. |
| 2003/0031794 A1 | 2/2003 | Tada et al. |
| 2003/0037730 A1 | 2/2003 | Yamasaki et al. |
| 2003/0049372 A1 | 3/2003 | Cook et al. |
| 2003/0066483 A1 | 4/2003 | Lee et al. |
| 2003/0094903 A1 | 5/2003 | Tao et al. |
| 2003/0098372 A1 | 5/2003 | Kim |
| 2003/0121608 A1 | 7/2003 | Chen et al. |
| 2003/0192645 A1 | 10/2003 | Liu |
| 2003/0213435 A1 | 11/2003 | Okuda et al. |
| 2004/0000270 A1 | 1/2004 | Carpenter et al. |
| 2004/0007188 A1 | 1/2004 | Burkhart et al. |
| 2004/0025786 A1 | 2/2004 | Kontani et al. |
| 2004/0040502 A1 | 3/2004 | Basceri et al. |
| 2004/0040503 A1 | 3/2004 | Basceri et al. |
| 2004/0083959 A1 | 5/2004 | Carpernter et al. |
| 2004/0083960 A1 | 5/2004 | Dando |
| 2004/0089240 A1 | 5/2004 | Dando et al. |
| 2004/0099377 A1 | 5/2004 | Newton et al. |
| 2004/0124131 A1 | 7/2004 | Aitchison et al. |
| 2004/0226507 A1 | 11/2004 | Carpenter et al. |
| 2004/0226516 A1 | 11/2004 | Daniel et al. |
| 2004/0238123 A1 | 12/2004 | Becknell et al. |
| 2005/0016956 A1 | 1/2005 | Liu et al. |
| 2005/0016984 A1 | 1/2005 | Dando |
| 2005/0022739 A1 | 2/2005 | Carpenter et al. |
| 2005/0028734 A1 | 2/2005 | Carpenter et al. |
| 2005/0039680 A1 | 2/2005 | Beaman et al. |
| 2005/0039686 A1 | 2/2005 | Zheng et al. |
| 2005/0045100 A1 | 3/2005 | Derderian |
| 2005/0045102 A1 | 3/2005 | Zheng et al. |
| 2005/0048742 A1 | 3/2005 | Dip et al. |
| 2005/0059261 A1 | 3/2005 | Basceri et al. |
| 2005/0061243 A1 | 3/2005 | Sarigiannis et al. |
| 2005/0081786 A1 | 4/2005 | Kubista et al. |
| 2005/0087130 A1 | 4/2005 | Derderian |
| 2005/0087132 A1 | 4/2005 | Dickey et al. |
| 2005/0087302 A1 | 4/2005 | Mardian et al. |
| 2005/0120954 A1 | 6/2005 | Carpenter et al. |
| 2005/0126489 A1 | 6/2005 | Beaman et al. |
| 2005/0133161 A1 | 6/2005 | Carpenter et al. |
| 2005/0145337 A1 | 7/2005 | Derderian et al. |
| 2005/0164466 A1 | 7/2005 | Zheng et al. |
| 2005/0217575 A1 | 10/2005 | Gealy et al. |
| 2005/0217582 A1 | 10/2005 | Kim et al. |
| 2006/0115957 A1 | 6/2006 | Basceri et al. |
| 2006/0121689 A1 | 6/2006 | Basceri et al. |
| 2006/0134345 A1 | 6/2006 | Rueger et al. |
| 2006/0165873 A1 | 7/2006 | Rueger et al. |
| 2006/0198955 A1 | 9/2006 | Zheng et al. |
| 2006/0204649 A1 | 9/2006 | Beaman et al. |
| 2006/0205187 A1 | 9/2006 | Zheng et al. |
| 2006/0213440 A1 | 9/2006 | Zheng et al. |
| 2006/0237138 A1 | 10/2006 | Qin |

FOREIGN PATENT DOCUMENTS

| | | |
|---|---|---|
| EP | 1 167 569 A1 | 1/2002 |
| JP | 62-235728 | 10/1987 |
| JP | 62-263629 | 11/1987 |
| JP | 63-020490 A | 1/1988 |
| JP | 63-111177 | 5/1988 |
| JP | 63-256460 A | 10/1988 |
| JP | 64-81311 | 3/1989 |
| JP | 1-273991 A | 11/1989 |
| JP | 4-100533 A | 4/1992 |
| JP | 4-213818 A | 8/1992 |
| JP | 6-151558 A | 5/1994 |
| JP | 06-201539 | 7/1994 |
| JP | 06-342785 | 12/1994 |
| JP | 6-342785 A | 12/1994 |
| JP | 60-54443 | 3/1995 |
| JP | 8-34678 A | 2/1996 |
| JP | 9-82650 A | 3/1997 |
| JP | 10-223719 A | 8/1998 |
| JP | 63-234198 | 9/1998 |
| JP | 11-172438 A | 6/1999 |
| JP | 2001-82682 A | 3/2001 |
| JP | 2001-261375 A | 9/2001 |
| JP | 2002-164336 A | 6/2002 |
| JP | 2001-254181-1 | 9/2002 |
| KR | 2005112371 | 11/2005 |
| SU | 598630 | 3/1978 |
| WO | WO-98/37258 A1 | 8/1998 |
| WO | WO-99/06610 A1 | 2/1999 |
| WO | WO-00/40772 A1 | 7/2000 |
| WO | WO-00/63952 A1 | 10/2000 |
| WO | WO-00/65649 A1 | 11/2000 |
| WO | WO-00/79019 A1 | 12/2000 |
| WO | WO-01/32966 | 5/2001 |
| WO | WO-01/46490 A1 | 6/2001 |
| WO | WO-02/45871 A1 | 6/2002 |
| WO | WO-02/48427 A1 | 6/2002 |
| WO | WO-02/073329 A2 | 9/2002 |
| WO | WO-02/073660 A2 | 9/2002 |
| WO | WO-02/081771 A2 | 9/2002 |
| WO | WO-02/095807 A2 | 11/2002 |
| WO | WO-03/008662 A2 | 1/2003 |
| WO | WO-03/016587 A1 | 2/2003 |
| WO | WO-03/033762 A1 | 4/2003 |
| WO | WO-03/208069 A2 | 4/2003 |
| WO | WO-03/035927 A2 | 5/2003 |
| WO | WO-03/052807 A1 | 6/2003 |

OTHER PUBLICATIONS

Aero Corporation, "Fundamentals of Mass Flow Control", 1 page, retrieved from the internet on Mar. 6, 2003, <http://www.aeramfc.com/funda.shtml>.

Bardell, R.L., et al., "Designing High-Performance Micro-Pumps Based on No-Moving-Parts Valves", DSC-vol. 62/HTD-vol. 354, Microelectromechanical Systems (MEMS) ASME 1997, pp. 47-53.

Cameron, I., "Atomic Layer Deposition Chamber Works at Low Temperatures", 2 pages, Electronic Times, Jul. 19, 2001, <http://www.electronictimes.com/story/OEG20010719S0042>.

Cowin, J.P., et al., "Measurement of Fast Desorption Kinetics of D2 From Tungsten By Laser Induced Thermal Desorption," Surface Science, vol. 78, pp. 545-564, 1978, North-Holland Publishing Company.

Cutting Edge Optronics, 600W QCW Laser Diode Array, Part No. ARR48P600, 2 pages, Oct. 2001, <www.ceolaser.com>.

Deublin Company, "Precision Rotating Connections for Water, Steam, Air, Hydraulic, Vacuum, Coolant and Hot Oil Service," 1 page, retrieved from the Internet on Feb. 4, 2002, <http://www.deublin.com>.

Deublin Company, "Rotating Unions", 1 page, retrieved from the Internet on Feb. 4, 2002, <http://www.com/products/rotatingunions.htm>.

Deublin Company, "Sealing,"2 pages, retrieved from the Internet on Feb. 4, 2002, <http://www.deublin.com/products/sealing.htm>.

EMCO Flow Systems, "Mach One™ Mass Flow Controllers", 1 page, retrieved from the internet on Nov. 7, 2003, <http://www.emcoflow.com/mach-one.htm>.

EMCO Flow Systems, "Mach One™ Mass Flow Controller Product Brochure" 12 pages, retrieved from the internet on Nov. 7, 2003, <http://www.emcoflow.com/literature/brochures_product_sheets/mach_one/mach_one_brochure_2_01.pdf>.

Engelke, F., et al., "Determination of Phenylthiohydantoin-Amino Acids by Two-Step Laser Sesorption/Multiphoton Ionization," Analytical Chemistry, vol. 59, No. 6, pp. 909-912, Mar. 15, 1987, The Americal Chemical Society.

Fitch, J.S., et al., "Pressure-Based Mass-Flow Control Using Thermopneumatically-Actuacted Microvalves," Proceedings, Sensors and Actuators Workshop, pp. 162-165 (Transducers Research Foundation, Cleveland, OH, 1998).

Henning, A.K. et al., "Contamination Reduction Using MEMS-BASED, High-Precision Mass Flow Controllers," Proceedings, SEMICON West Symposium on Contamination Free Manufacturing for Semiconductor Processing (SEMI, Mountain View, CA, 1998), pp. 1-11.

Henning, A.K., "Liquid and gas-liquid phase behavior in thermopneumatically actuated microvalves," Proceedings, Micro Fluidic Devices and Systems (SPIE, Bellingham, WA, 1998; A.B. Frazier and C.H. Ahn, eds.), vol. 3515, pp. 53-63.

Henning, A.K., "Microfluidic MEMS," Proceedings, IEEE Aerospace Conference, Paper 4.906 (IEEE Press, Piscataway, NJ, 1998), 16 pages.

Henning, A.K., et al., "A thermopneumatically actuated microvalve for liquid expansion and proportional control", Proceedings, TRANSDUCERS '97: 1997 International Solid State Sensors and Actuators Conference, pp. 825-828.

Henning, A.K., et al., "Microfluidic MEMS for Semiconductor Processing," IEEE Trans. Components, Packaging, and Manufacturing Technology B21, pp. 329-337, 1998.

Henning, A.K., et al., "Performance of MEMS-Based Gas Distribution and Control Systems for Semiconductor Processing", 8 pages, Proceeedings, SEMICON West Workshop on Gas Distribution (SEMI, Mountain View, CA, 1998).

Henning, A.K., et al., "Performance of MEMS-Based Gas Distribution and Control Systems for Semiconductor Processing," Proceedings, Micromachined Devices and Components (SPIE, Bellingham, WA, 1998; P.J. French and K. Chau, eds.), vol. 3514, pp. 159-170.

Integrated Process Systems Ltd., "ALD & CVD", 2 pages, retrieved from the internet on Dec. 11, 2001, <http://www.ips-tech.com/eng/pro-p2-2.htm>.

Integrated Process Systems Ltd., "Nano-ALD", 2 pages, retrieved from the Internet on Dec. 11, 2001, <http://www.ips-tech.com/eng/pro-p2.htm>.

Integrated Process Systems Ltd., "Welcom to IPS Ltd.", 1 page, retrieved from the Internet on Dec. 11, 2001, <http://www.ips-tech.com/eng/main.htm>.

Maillerfer, D., et al., "A High-Performance Silicon Micropump for Disposable Drug Delivery Systems," pp. 413-417, IEEE, 2001.

Olsson, A., "Valve-less Diffuser Micropumps", ISSN 0281-2878, 66 pages, 1998.

Peters, L., "Thermal Processing's Tool of Choice: Single-Wafer RTP or Fast Ramp Batch?" Semiconductor International, Apr. 1, 1998, 8 pages, <http://www.e-incite.net/semiconductor/index.asp?alyout+article&articleid=CA163937>.

Ready, J.F., "Effects Due to Absorption of Laser Radiation," Journal of Applied Physics, vol. 36, No. 2, pp. 462-468, Feb. 1965, Journal of Applied Physics, American Institute of Physics.

SemiZone, EMCO Flow Systems Granted Patent for the Mach One™ Mass Floww Controller for the Semiconductor Industry (Jun. 28, 2001), 2 pages, retrieved from the internet on Nov. 7, 2003, <http://www.semizone.com/news/item?news_item_id+100223>.

Takahashi, K. et al., "Process Integration of 3D Chip Stack with Vertical Interconnection," pp. 601-609, 2004 Electronic Components and Technology Conference, IEEE, Jun. 2004.

The University of Adelaide, Australia, Department of Chemistry, "Spectroscopy", 2 pages, retrieved from the Internet on Feb. 9, 2002, <http://www.chemistry.adelaide.edu.au/external/Soc-Rel/Content/spectros.htm>.

Tokyo Electron Limited, Plasma Process System, Trias SPA, 1 page, retrieved from the Internet on Oct. 16, 2004, <http://www.tel.com/eng/products/spe/sdtriasspa.htm>.

University of California, Berkeley, University Extension, "Atomic Layer Deposition," 5 pages, Sep. 24-25, 2001, <http://www.unex.berkeley.edu/eng/br225/1-1.html>.

Zare, R.N., et al. "Mass Spectrometry of Molecular Adsorbates Using Laser Desorption/Laser Multiphoton Ionization," Bulletin of the Chemical Society of Japan, vol. 61, No. 1, pp. 87-92, Jan. 1988.

MKS Instruments, Data Sheet, Downstream Plasma Source, Type AX7610, 4 pages, Dec. 2002, <http://www.mksinst.com/docs/UR/ASTEXax7610DS.pdf>.

MKS Instruments, ASTeX® Microwave Plasma Sources and Subsystems, 1 page, retrieved from the Internet on Nov. 19, 2004, <http://www.mksinst.com/PRG2.html>.

* cited by examiner

METHODS FOR CONTROLLING MASS FLOW RATES AND PRESSURES IN PASSAGEWAYS COUPLED TO REACTION CHAMBERS AND SYSTEMS FOR DEPOSITING MATERIAL ONTO MICROFEATURE WORKPIECES IN REACTION CHAMBERS

TECHNICAL FIELD

The present invention is related to methods for controlling mass flow rates and pressures in passageways coupled to reaction chambers, and systems for depositing material in thin film deposition processes used in the manufacturing of microfeatures.

BACKGROUND

Thin film deposition techniques are widely used in the manufacturing of microfeatures to form a coating on a workpiece that closely conforms to the surface topography. The size of the individual components in the devices is constantly decreasing, and the number of layers in the devices is increasing. As a result, the density of components and the aspect ratios of depressions (i.e., the ratio of the depth to the size of the opening) are increasing. The size of workpieces is also increasing to provide more real estate for forming more dies (i.e., chips) on a single workpiece. Many fabricators, for example, are transitioning from 200 mm to 300 mm workpieces, and even larger workpieces will likely be used in the future. Thin film deposition techniques accordingly strive to produce highly uniform conformal layers that cover the sidewalls, bottoms, and corners in deep depressions that have very small openings.

One widely used thin film deposition technique is Chemical Vapor Deposition (CVD). In a CVD system, one or more precursors that are capable of reacting to form a solid thin film are mixed in a gas or vapor state, and then the precursor mixture is presented to the surface of the workpiece. The surface of the workpiece catalyzes the reaction between the precursors to form a solid thin film at the workpiece surface. A common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are not typically desirable because heating the workpiece can be detrimental to the structures and other materials already formed on the workpiece. Implanted or doped materials, for example, can migrate within the silicon substrate at higher temperatures. On the other hand, if more reactive precursors are used so that the workpiece temperature can be lower, then reactions may occur prematurely in the gas phase before reaching the substrate. This is undesirable because the film quality and uniformity may suffer, and also because it limits the types of precursors that can be used.

Figure 1A:
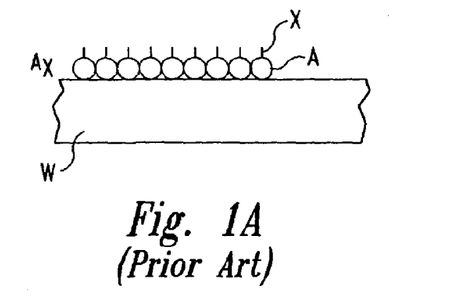
FIGS. 1A and 1B are schematic cross-sectional views of stages in ALD processing in accordance with the prior art.
Figure 1B:
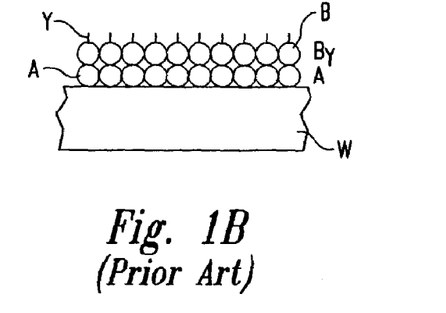

Atomic Layer Deposition (ALD) is another thin film deposition technique. FIGS. 1A and 1B schematically illustrate the basic operation of ALD processes. Referring to FIG. 1A, a layer of gas molecules A, coats the surface of a workpiece W. The layer of $A_x$ molecules is formed by exposing the workpiece W to a precursor gas containing $A_x$ molecules and then purging the chamber with a purge gas to remove excess $A_x$ molecules. This process can form a monolayer of $A_x$ molecules on the surface of the workpiece W because the $A_x$ molecules at the surface are held in place during the purge cycle by physical adsorption forces at moderate temperatures or chemisorption forces at higher temperatures. Referring to FIG. 1B, the layer of $A_x$ molecules is then exposed to another precursor gas containing $B_y$ molecules. The $A_x$ molecules react with the $B_y$ molecules to form an extremely thin layer of solid material on the workpiece W. The chamber is then purged again with a purge gas to remove excess $B_y$ molecules.

Figure 2:
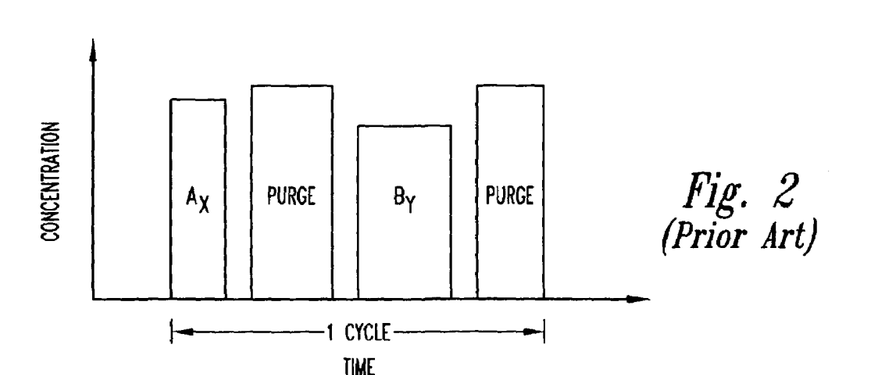
FIG. 2 is a graph illustrating a cycle for forming a layer using ALD techniques in accordance with the prior art.

FIG. 2 illustrates the stages of one cycle for forming a thin solid layer using ALD techniques. A typical cycle includes (a) exposing the workpiece to the first precursor $A_x$, (b) purging excess $A_x$ molecules, (c) exposing the workpiece to the second precursor $B_y$, and then (d) purging excess $B_y$ molecules. In actual processing, several cycles are repeated to build a thin film on a workpiece having the desired thickness. For example, each cycle may form a layer having a thickness of approximately 0.5-1.0 Å, and thus it takes approximately 60-120 cycles to form a solid layer having a thickness of approximately 60 Å.

Figure 3:
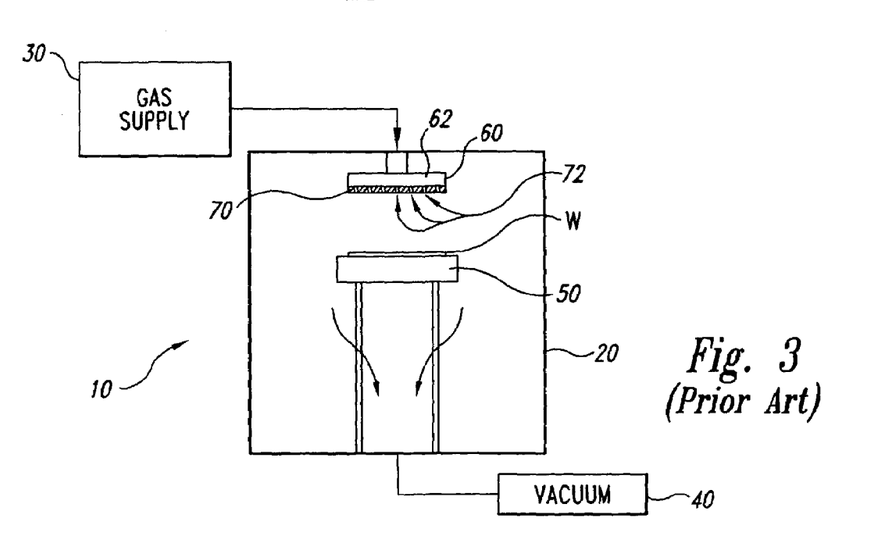
FIG. 3 is a schematic representation of a system including a reactor for depositing material onto a microfeature workpiece in accordance with the prior art.

FIG. 3 schematically illustrates a single-wafer ALD reactor 10 having a reaction chamber 20 coupled to a gas supply 30 and a vacuum 40. The reactor 10 also includes a heater 50 that supports the workpiece W and a gas dispenser 60 in the reaction chamber 20. The gas dispenser 60 includes a plenum 62 operably coupled to the gas supply 30 and a distributor plate 70 having a plurality of holes 72. In operation, the heater 50 heats the workpiece W to a desired temperature, and the gas supply 30 selectively injects the first precursor $A_x$, the purge gas, and the second precursor $B_y$, as shown above in FIG. 2. The vacuum 40 maintains a negative pressure in the chamber to draw the gases from the gas dispenser 60 across the workpiece W and then through an outlet of the reaction chamber 20.

One drawback of ALD processing is that it has a relatively low throughput compared to CVD techniques. For example, each $A_x$-purge-$B_y$-purge cycle can take several seconds. This results in a total process time of several minutes to form a single thin layer of only 60 Å. In contrast to ALD processing, CVD techniques require only about one minute to form a 60 Å thick layer. The low throughput of existing ALD techniques limits the utility of the technology in its current state because ALD may be a bottleneck in the overall manufacturing process.

Another drawback of ALD and pulsed CVD processing is that it is difficult to control the amount of gas in the chamber at the beginning of a pulse. In ALD and CVD processing, a mass flow controller or a pressure controller typically controls the flow of precursors into the reactor. For example, when a mass flow controller controls the gas flow, the beginning of the pulse can have an undesirably high flow rate. Mass flow controllers are susceptible to producing high initial flow rates because they continue to cause the gas to flow through the gas line even when a final valve in the supply line is closed to prevent the precursor from flowing into the reactor. This causes the pressure in the supply line to continually increase. Moreover, as the flow rate drops when the final valve is closed, the mass flow controller causes an upstream valve to open more. As such, when the final valve opens, the increased pressure in the supply line and the open upstream valve creates a large inrush of precursors into the reaction chamber. This can cause premature reactions between the precursors or remove molecules from the surface of the workpiece W, which can result in a nonuniform surface on the workpiece W. Furthermore, the increased pressure in the supply line can cause the final valve to dispense too much precursor into the reaction chamber, which can make it difficult to purge or otherwise remove the excess precursor from the reaction chamber.

Systems that use pressure controllers to control the gas flow also have drawbacks. For example, the pressure controller typically has a fixed or adjustable orifice in the gas supply line to limit the precursor flow when the pressure drops downstream. The pressure controller, however, cannot control the mass flow rate, and consequently, differences in the downstream pressure can cause different mass flow rates in the gas supply line. Accordingly, too much or too little precursor may be dispensed into the reaction chamber in systems that rely on pressure controllers to modulate the gas flow into the reactor. Thus, there is a need to improve the process of providing precursors to reactors.

DETAILED DESCRIPTION

A. Overview

The following disclosure describes several embodiments of mass flow and pressure control units, systems including mass flow and pressure control units, and methods for controlling mass flow rates and pressures in passageways. Many specific details of the invention are described below with reference to single-wafer reactors for depositing materials onto microfeature workpieces, but several embodiments can be used in batch systems for processing a plurality of workpieces simultaneously. The term "microfeature workpiece" is used throughout to include substrates upon which and/or in which microelectronic devices, micromechanical devices, data storage elements, read/write components, and other features are fabricated. For example, microfeature workpieces can be semiconductor wafers such as silicon or gallium arsenide wafers, glass substrates, insulative substrates, and many other types of materials. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 4-7 and the following text to provide a thorough understanding of particular embodiments of the invention. A person skilled in the art will understand, however, that the invention may have additional embodiments, or that the invention may be practiced without several of the details of the embodiments shown in FIGS. 4-7.

One aspect of the invention is directed to a method for controlling a mass flow rate and a pressure in a passageway. In one embodiment, the method includes controlling a mass flow rate in a passageway in response to a first condition by modulating a valve of a mass flow and pressure control unit. The method further includes controlling a pressure in the passageway in response to a second condition by modulating the valve of the mass flow and pressure control unit. In one aspect of this embodiment, the method can further include determining the pressure in the passageway and determining the mass flow rate in the passageway. The first condition can include the determined mass flow rate in the passageway and the second condition can include the determined pressure in the passageway.

In another embodiment of the invention, the method includes regulating a first valve of a mass flow and pressure control unit to control a pressure in a passageway when a second valve in the passageway is in a first position. The method further includes regulating the first valve of the mass flow and pressure control unit to control a mass flow rate in the passageway when the second valve is in a second position. The second valve is downstream from the mass flow and pressure control unit, and the first and second positions can be closed or at least partially open positions. In one aspect of this embodiment, regulating the first valve can include modulating the first valve to control the mass flow rate when the second valve is in the at least partially open position and when the determined pressure in the passageway is less than or equal to a predetermined pressure. In another aspect of this embodiment, regulating the first valve to control the pressure includes modulating the first valve in response to a determined pressure in the passageway, and regulating the first valve to control the mass flow rate includes modulating the first valve in response to a determined mass flow rate.

Another aspect of the invention is directed to a mass flow and pressure control apparatus for controlling a mass flow rate and a pressure in a conduit with a passageway. The apparatus includes a mass flow measurement device coupled to the conduit to determine the mass flow rate in the passageway, a pressure sensor coupled to the conduit to determine the pressure in the passageway, a modulating valve in the passageway, and a controller operably coupled to the mass flow measurement device, the pressure sensor, and the modulating valve. The controller has a computer-readable medium containing instructions to perform any one of the above-mentioned methods.

B. Deposition Systems

Figure 4:
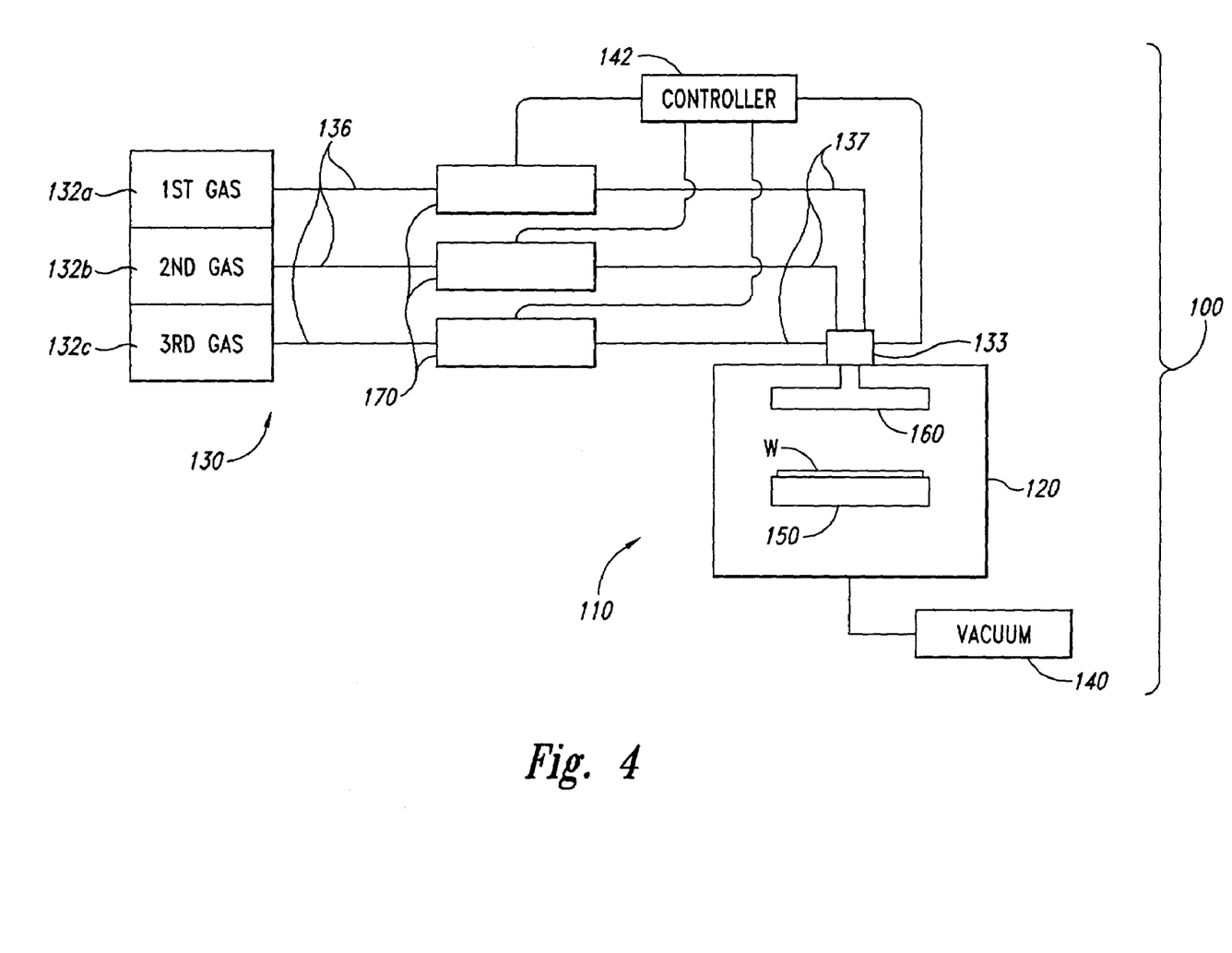
FIG. 4 is a schematic representation of a system including a plurality of mass flow and pressure control units, and a reactor for depositing material onto a microfeature workpiece in accordance with one embodiment of the invention.

FIG. 4 is a schematic representation of a system 100 for depositing material onto a microfeature workpiece W in accordance with one embodiment of the invention. In this embodiment, the system 100 includes a reactor 110 having a reaction chamber 120 coupled to a gas supply 130 and a vacuum 140. The reactor 110 also includes a gas distributor 160 coupled to the reaction chamber 120 and the gas supply 130 to dispense the gas(es) into the reaction chamber 120 and onto the workpiece W.

The gas supply 130 includes a plurality of gas sources 132 (identified individually as 132a-c) and a plurality of first gas conduits 136 coupled to the gas sources 132. The gas sources 132 can include a first gas source 132a for providing a first gas, a second gas source 132b for providing a second gas, and a third gas source 132c for providing a third gas. The first and second gases can be first and second precursors, respectively. The third gas can be a purge gas. The first and second precursors are the gas or vapor phase constituents that react to form the thin, solid layer on the workpiece W. The purge gas can be a suitable type of gas that is compatible with the reaction chamber 120 and the workpiece W. In other embodiments, the gas supply 130 can include a different number of gas sources 132 for applications that require additional precursors or purge gases. In additional embodiments, the gas sources 132 can include one or more etchants for deposition onto a microfeature workpiece during etching.

The system 100 of the illustrated embodiment also includes a plurality of mass flow and pressure control (MFPC) units 170 (shown schematically) coupled to the first gas conduits 136, a plurality of second gas conduits 137 coupled to the MFPC units 170, and a valve assembly 133 coupled to the second gas conduits 137. The MFPC units 170 are operated by a controller 142 that generates signals for controlling the mass flow rate and the pressure of the gas(es) in the second gas conduits 137, as described in greater detail below. The valve assembly 133 is also operated by the controller 142 to control the flow of gases through the reaction chamber 120 for ALD and CVD applications. For example, the controller 142 can be programmed to operate the valve assembly 133 to pulse the gases individually through the gas distributor 160 in ALD applications or mix selected precursors in the gas distributor 160 in CVD applications. In additional embodiments, the system 100 can have other configurations. For example, several gas conduits can be coupled to a single MFPC unit. In this embodiment, a MFPC unit could be coupled to a first conduit carrying a precursor and a second conduit carrying a purge gas.

In the illustrated embodiment, the reactor 110 also includes a workpiece support 150 to hold the workpiece W in the reaction chamber 120. In one aspect of this embodiment, the workpiece support 150 can be heated to bring the workpiece W to a desired temperature for catalyzing the reaction between the first gas and the second gas at the surface of the workpiece W. For example, the workpiece support 150 can be a plate with a heating element. The workpiece support 150, however, may not be heated in other applications.

C. Mass Flow and Pressure Control Units

Figure 5:
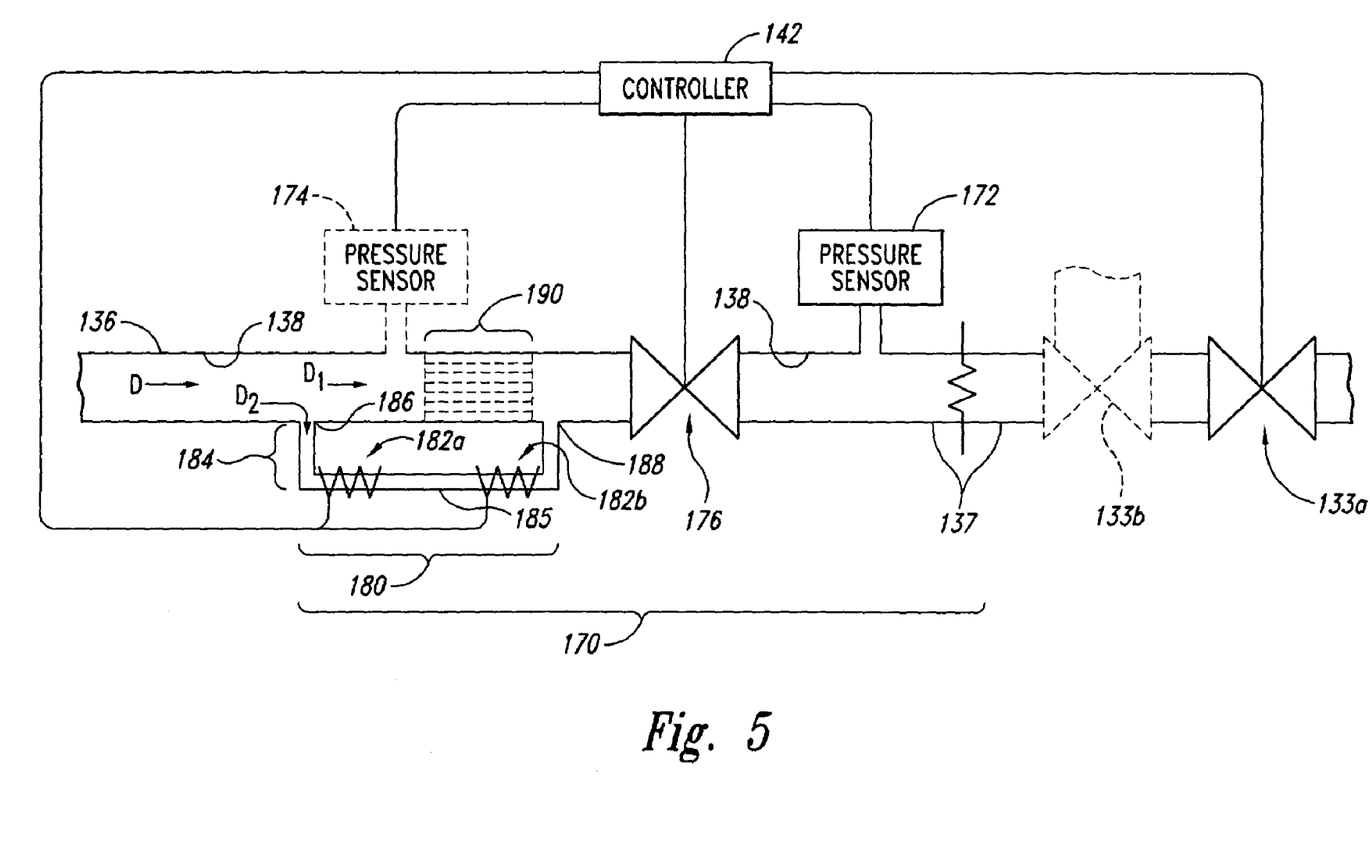
FIG. 5 is a schematic representation of an embodiment of a mass flow and pressure control unit for use in the system shown in FIG. 4.

FIG. 5 is a schematic representation of an embodiment of a MFPC unit 170 for use in the system 100 shown in FIG. 4. The MFPC unit 170 controls the mass flow rate and the pressure of the gas to provide the desired amount of gas to the reactor 110 (FIG. 4) at the desired pressure. The MFPC unit 170 is coupled to the first and second gas conduits 136 and 137, which each include a passageway 138. The gas flows in the direction D through the passageway 138 from the first gas conduit 136, through the MFPC unit 170, and into the second gas conduit 137. The MFPC unit 170 controls both the mass flow rate and pressure of the gas in the second gas conduit 137.

The MFPC unit 170 includes a mass flow measurement device 180 in fluid communication with the passageway 138 to determine the mass flow through the passageway 138. In the illustrated embodiment, the mass flow measurement device 180 includes a laminar flow section 190 in the passageway 138 and a bypass 184 around the laminar flow section 190 of the passageway 138. The laminar flow section 190 can include a plurality of flow tubes or other devices to create a laminar flow of the gas. The laminar flow section 190 causes the ratio of the gas $D_1$ flowing through the laminar flow section 190 to the gas $D_2$ flowing through the bypass 184 to remain constant.

The bypass 184 includes a first temperature element 182a electrically coupled to the controller 142, a second temperature element 182b electrically coupled to the controller 142, an inlet 186, and an outlet 188. The first and second temperature elements 182a-b measure the temperature change in the gas as it flows through a portion of the bypass 184. For example, in one embodiment, the bypass 184 can include a tube 185, and the first and second temperature elements 182a-b can include resistance thermometer elements that are wound around the tube 185. The tube 185 can be heated by applying an electrical current to the resistance thermometer elements. The gas cools as it flows through the tube 185 and thus creates a temperature difference between the two resistance thermometer elements. The temperature difference causes a change in the resistance of the thermometer elements that can be measured as an electrical signal. The temperature difference between the first and second temperature elements 182a-b is dependent on the mass flow of the gas and is a function of the gas's density, specific heat, and flow rate. Accordingly, the controller 142 can calculate the mass flow of the gas in the passageway 138 from the temperature difference between the first and second temperature elements 182a-b. In other embodiments, the temperature elements 182 can include thermal couples or other suitable devices to determine the temperature of the gas in the bypass 184, or the mass flow measurement device 180 can determine the mass flow of the gas through the passageway 138 with other methods or devices.

The MFPC unit 170 further includes a first pressure sensor 172 that is operably coupled to the controller 142 to determine the pressure in the passageway 138 of the second gas conduit 137. The first pressure sensor 172 can be a Baratron® capacitance manometer manufactured by MKS Instruments, Inc. of Andover, Mass., or any other suitable device. In some embodiments, the MFPC unit 170 can also include a second pressure sensor 174 (shown in hidden lines) that measures the pressure in the passageway 138 of the first gas conduit 136. In other embodiments, the MFPC unit 170 may not include the second pressure sensor 174.

The MFPC unit 170 also includes a modulating valve 176 that is positioned in the passageway 138 to regulate the flow of gas between the first and second gas conduits 136 and 137. The controller 142 is operably coupled to the modulating valve 176 to selectively control the position of the valve 176 and accordingly the gas flow through the valve 176. The modulating valve 176 can be driven by a piezoelectric, solenoid, thermal, or other suitable actuator. The controller 142 is also operably coupled to a valve 133a of the valve assembly 133 (FIG. 4). The valve 133a controls the flow of gas from the second gas conduit 137 into the reaction chamber 120 (FIG. 4).

In operation, in the illustrated embodiment, the first and second pressure sensors 172 and 174, the first and second temperature elements 182a-b, and the valve 133a provide electrical signals to the controller 142 as inputs. Based on at least one of these inputs, a predetermined mass flow rate setpoint, and/or a predetermined pressure setpoint, the controller 142 provides an electrical signal as an output to the modulating valve 176 indicating the proper position of the modulating valve 176. The modulating valve 176 responds accordingly to restrict or open the passageway 138 and thereby control the mass flow rate or pressure in the second gas conduit 137.

Figure 6:
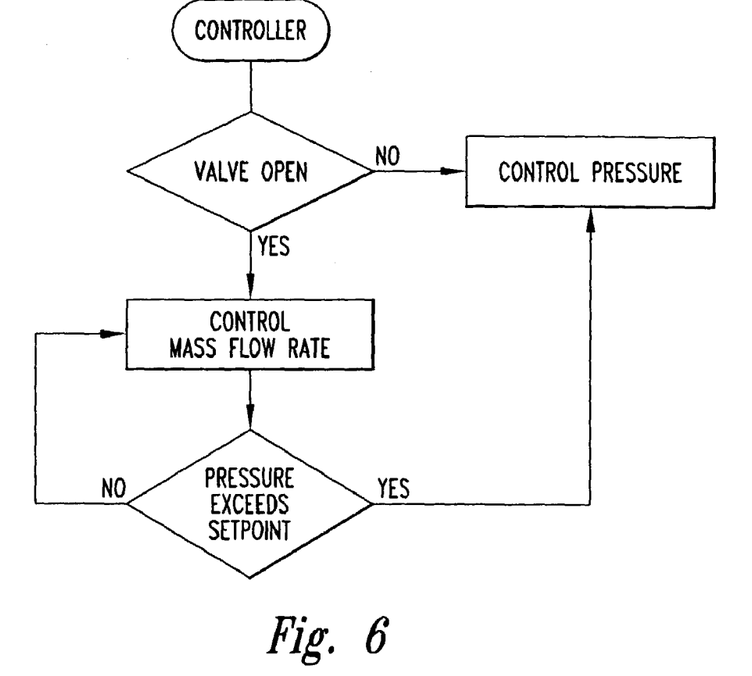
FIG. 6 is a flow diagram illustrating one method of prioritizing between regulating the mass flow rate and regulating the pressure.

The controller 142 can be programmed to prioritize between regulating the mass flow rate and regulating the pressure. FIG. 6 is a flow diagram illustrating one method of prioritizing between regulating the mass flow rate and regulating the pressure. Referring to FIGS. 5 and 6, in one embodiment, such as in an ALD or CVD application, the position of the valve 133a determines whether the controller 142 regulates the mass flow rate or the pressure. For example, when the valve 133a is closed and the gas is charged in the second gas conduit 137, the controller 142 can control the pressure of the gas in the second gas conduit 137. More specifically, the second gas conduit 137 can be pressurized to the predetermined pressure setpoint. Accordingly, the controller 142 opens the modulating valve 176 to allow gas to flow into the second gas conduit 137 until the pressure in the conduit 137 reaches the pressure setpoint. When the pressure in the second gas conduit 137 reaches the pressure setpoint, the controller 142 closes the modulating valve 176 to limit the pressure in the second gas conduit 137. When the valve 133a opens to deliver the pressurized gas into the reaction chamber 120 (FIG. 4), the controller 142 can control the mass flow rate of the gas flowing into the second gas conduit 137 by regulating the modulating valve 176. For example, the controller 142 can open the modulating valve 176 until the mass flow rate reaches the mass flow rate setpoint.

In one aspect of this embodiment, when the valve 133a is open the controller 142 can control the pressure instead of the mass flow rate if the pressure in the second gas conduit 137 exceeds the pressure setpoint. When the valve 133a is subsequently closed, the controller 142 can continue to control the pressure in the second gas conduit 137 as described above. In additional embodiments, the controller 142 can control the pressure when the valve 133a is open for reasons other than those described above. For example, the controller 142 can control the pressure when the reaction chamber 120 (FIG. 4) is being purged.

Figure 7:
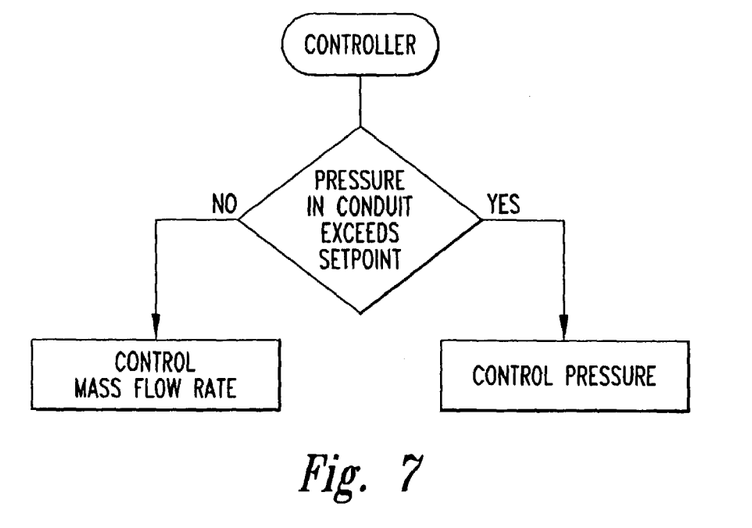
FIG. 7 is a flow diagram illustrating another method of prioritizing between regulating the mass flow rate and regulating the pressure.

FIG. 7 is a flow diagram illustrating another method of prioritizing between regulating the mass flow rate and regulating the pressure. Referring to FIGS. 5 and 7, the controller 142 can prioritize between regulating the mass flow rate and regulating the pressure based on the pressure in the second gas conduit 137. In this embodiment, the controller 142 can regulate the modulating valve 176 to control the mass flow rate through the passageway 138 until the pressure in the second gas conduit 137 exceeds the pressure setpoint. When the pressure in the second gas conduit 137 exceeds the pressure setpoint, the controller 142 regulates the modulating valve 176 to limit the pressure in the second gas conduit 137 to the pressure setpoint. As soon as the pressure in the second gas conduit 137 falls below the pressure setpoint, the controller 142 can revert back to controlling the mass flow rate in the passageway 138.

In another embodiment of the invention, the controller 142 can prioritize between regulating the mass flow rate and regulating the pressure based on the pressure in the first gas conduit 136 as measured by the second pressure sensor 174. The second pressure sensor 174 measures the pressure upstream of the modulating valve 176 and thus enables the controller 142 to anticipate changes to the pressure in the second gas conduit 137. In other embodiments, the controller 142 can prioritize between controlling the mass flow rate and controlling the pressure based on other factors.

Referring back to FIG. 5, in additional embodiments, the system 100 may include a valve 133b (shown in hidden lines) between the valve 133a and the MFPC unit 170 to divert gas flow into a bypass in order to purge the first and second gas conduits 136 and 137. In such an embodiment, the controller 142 could control the mass flow rate of the purge gas in the passageway 138.

One advantage of the MFPC units of the illustrated embodiments is the ability to control both the mass flow rate and pressure of a gas flowing into a reaction chamber. For example, the ability to control the pressure in the gas conduit prevents a large inrush of gas into the reactor when the valve to the reaction chamber is opened. The large inrush of gas can cause premature reactions between precursors, remove material from the surface of the workpiece, and result in too much gas being dispensed into the reaction chamber. The ability to control the mass flow rate allows the controller to ensure the reaction chamber receives the proper amount of gas.

From the foregoing, it will be appreciated that specific embodiments of the invention have been described herein for purposes of illustration but that various modifications may be made without deviating from the spirit and scope of the invention. Accordingly, the invention is not limited except as by the appended claims.

We claim:

1. A method for controlling a vapor deposition process in a reaction chamber, the method comprising:
    positioning a first valve upstream a second valve in a passageway, the second valve being upstream the processing chamber;
    receiving an electrical signal from the second valve, the electrical signal indicating a position of the second valve;
    if the monitored electrical signal indicates that the second valve is substantially closed, regulating a pressure in the passageway to a predetermined pressure setpoint; and
    if the monitored electrical signal indicates that the second valve is at least partially open, regulating a mass flow rate in the passageway to a predetermined mass flow rate setpoint, wherein the first valve is modulated to alternatively regulate the pressure in the passageway to the predetermined pressure setpoint or to regulate the mass flow rate in the passageway to the predetermined mass flow rate setpoint.

2. The method of claim 1, further comprising:
    determining the pressure in the passageway; and
    wherein regulating a mass flow rate comprises modulating the first valve to control the mass flow rate when the second valve is in the at least partially open position and when the determined pressure in the passageway is less than or equal to a predetermined pressure.

3. The method of claim 1, further comprising:
    determining the pressure in the passageway; and
    determining the mass flow rate in the passageway;
    wherein regulating a pressure comprises modulating the first valve in response to the determined pressure in the passageway; and
    wherein regulating a mass flow rate comprises modulating the first valve in response to the determined mass flow rate in the passageway.

4. The method of claim 1, further comprising:
    determining the pressure in the passageway downstream from the first valve;
    determining the pressure in the passageway upstream from the first valve; and wherein regulating a pressure comprises modulating the first valve to control the pressure in response to the determined pressure in the passageway downstream and/or upstream from the first valve.

5. The method of claim 1 wherein regulating a mass flow rate comprises controlling the mass flow rate as a gas flows through the passageway and into a reaction chamber.

6. The method of claim 1 wherein regulating a mass flow rate comprises controlling the pressure in the passageway when the passageway is charged with a gas.

7. A method for controlling a vapor deposition process in a reaction chamber, the method comprising:
   positioning a first valve upstream a second valve in a passageway, the second valve being upstream the processing chamber;
   receiving an electrical signal from the second valve, the electrical signal indicating a position of the second valve;
   if the monitored electrical signal indicates that the second valve is in a first position, regulating a pressure in the passageway to a predetermined pressure setpoint by modulating the first valve instead of regulating a mass flow rate in the passageway to a predetermined mass flow rate setpoint by modulating the first valve; and
   if the monitored electrical signal indicates that the second valve is in a second position different than the first position, regulating the mass flow rate in the passageway to the predetermined mass flow rate setpoint by modulating the first valve instead of regulating the pressure in the passageway to the predetermined pressure setpoint by modulating the first valve.

8. The method of claim 7, further comprising:
   measuring the pressure in the passageway; and
   wherein regulating a pressure in the passageway includes opening the first valve to allow a gas to flow into the passageway until the measured pressure in the passageway reaches the predetermined pressure setpoint and closing the first valve to limit the pressure in the passageway after the measured pressure in the passageway reaches the predetermined pressure setpoint.

9. The method of claim 7, further comprising:
   measuring the mass flow rate in the passageway; and
   wherein regulating a mass flow rate in the passageway includes opening the first valve until the measured mass flow rate reaches the predetermined mass flow rate setpoint.

10. The method of claim 7 wherein the first position indicates that the second valve is substantially closed, and the second position indicates that the second valve is at least partially open.

11. The method of claim 7 wherein regulating a mass flow rate comprises controlling the mass flow rate as a gas flows through the passageway and into a reaction chamber.

12. The method of claim 7 wherein regulating a mass flow rate comprises controlling the pressure in the passageway when the passageway is charged with a gas.

13. A method for controlling a vapor deposition process in a reaction chamber, the method comprising:
   positioning a first valve upstream a second valve in a passageway, the second valve being upstream the processing chamber;
   measuring a pressure in the passageway;
   if the measured pressure exceeds a predetermined pressure setpoint, regulating the pressure in the passageway to the predetermined pressure setpoint by modulating the first valve; and
   if the measured pressure is below the predetermined pressure threshold, regulating a mass flow rate in the passageway to a predetermined mass flow rate setpoint by modulating the first valve, wherein the first valve is modulated to alternatively regulate the pressure in the passageway to the predetermined pressure setpoint or to regulate the mass flow rate in the passageway to the predetermined mass flow rate setpoint.

14. The method of claim 13 wherein regulating a pressure in the passageway includes modulating the first valve to limit the pressure in the passageway after the measured pressure in the passageway exceeds the predetermined pressure setpoint.

15. The method of claim 13, further comprising:
   measuring the mass flow rate in the passageway; and
   wherein regulating a mass flow rate in the passageway includes opening the first valve until the measured mass flow rate reaches the predetermined mass flow rate setpoint.

16. The method of claim 13 wherein regulating a mass flow rate comprises controlling the mass flow rate as a gas flows through the passageway and into a reaction chamber.

17. The method of claim 13 wherein regulating a mass flow rate comprises controlling the pressure in the passageway when the passageway is charged with a gas.

* * * * *